United States Patent
Lee et al.

(10) Patent No.: US 12,527,186 B2
(45) Date of Patent: Jan. 13, 2026

(54) DISPLAY DEVICE AND MANUFACTURING METHOD THEREOF

(71) Applicant: Samsung Display Co., LTD., Yongin-si (KR)

(72) Inventors: Kyung-Mok Lee, Yongin-si (KR); Dong-Youb Lee, Yongin-si (KR); Jaejin Oh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 430 days.

(21) Appl. No.: 18/199,835

(22) Filed: May 19, 2023

(65) Prior Publication Data
US 2024/0065049 A1 Feb. 22, 2024

(30) Foreign Application Priority Data
Aug. 16, 2022 (KR) .................. 10-2022-0102063

(51) Int. Cl.
| | |
|---|---|
| *H10K 59/131* | (2023.01) |
| *H10K 59/12* | (2023.01) |
| *H10K 59/40* | (2023.01) |
| *H10K 59/80* | (2023.01) |
| *H10K 77/10* | (2023.01) |
| *H10K 102/00* | (2023.01) |

(52) U.S. Cl.
CPC ....... *H10K 59/131* (2023.02); *H10K 59/1201* (2023.02); *H10K 59/40* (2023.02); *H10K 59/873* (2023.02); *H10K 77/111* (2023.02); *H10K 2102/311* (2023.02)

(58) Field of Classification Search
CPC .. H10K 59/131; H10K 59/1201; H10K 59/40; H10K 59/873; H10K 77/111; H10K 2102/311; H10K 59/8794; H10K 59/12; H10K 50/84; H10K 59/1213; H10K 71/00; G06F 1/1652; G06F 3/0448; G09F 9/301
See application file for complete search history.

(56) References Cited

U.S. PATENT DOCUMENTS

| | | | | |
|---|---|---|---|---|
| 10,050,227 | B2* | 8/2018 | Park | H10K 59/126 |
| 2017/0048977 | A1* | 2/2017 | Siddique | H05K 1/118 |
| 2019/0090354 | A1* | 3/2019 | Shinohara | C09J 7/30 |
| 2024/0029633 | A1* | 1/2024 | Won | G09G 3/32 |
| 2024/0423017 | A1* | 12/2024 | Cha | H05K 1/028 |

FOREIGN PATENT DOCUMENTS

| | | |
|---|---|---|
| KR | 1020190079728 | 7/2019 |
| KR | 102107149 | 5/2020 |
| KR | 1020200112068 | 10/2020 |
| KR | 1020210024272 | 3/2021 |
| KR | 1020210080675 | 7/2021 |

* cited by examiner

*Primary Examiner* — J. E. Schoenholtz
(74) *Attorney, Agent, or Firm* — CANTOR COLBURN LLP

(57) ABSTRACT

A display device includes a display panel including a display area and a peripheral area, a protective film attached to a lower surface of the display panel, an adhesive layer disposed between the display panel and the protective film, a driving integrated circuit ("IC") chip disposed in the peripheral area and including a long side and a short side, and a heat blocking part disposed in the peripheral area, and spaced apart from the short side of the driving IC chip by a predetermined distance in a direction parallel to the long side.

20 Claims, 11 Drawing Sheets

DISPLAY DEVICE AND MANUFACTURING METHOD THEREOF

This application claims priority to Korean Patent Application No. 10-2022-0102063, filed on Aug. 16, 2022, and all the benefits accruing therefrom under 35 U.S.C. § 119, the content of which in its entirety is herein incorporated by reference.

BACKGROUND

1. Field

The disclosure relates to a display device and a manufacturing method thereof.

2. Description of the Related Art

A display device displays an image, and includes a liquid crystal display ("LCD"), an organic light-emitting diode ("OLED") display, and the like. The display device is used in various electronic devices such as a mobile phone, a navigation device, a digital camera, an electronic book, a portable game machine, and various terminals.

Such a display device includes a display panel including a plurality of pixels and a driver supplying a signal to the plurality of pixels. A plurality of gate lines and a plurality of data lines are formed in the display panel, and each pixel is connected to the corresponding gate line and the corresponding data line to receive a predetermined signal. The driver may be formed in a form of a driving integrated circuit ("IC") chip. The driving IC chip may be attached to one end of the display panel in a form of a chip-on-plastic ("COP") panel, a chip-on-glass ("COG"), a chip-on-film ("COF"), a chip-on-board ("COB"), or the like.

SUMMARY

A support member such as a film may be attached to the display device to protect the display panel, and in this case, an adhesive layer may be disposed between the display panel and the support member. In a process of attaching the driving integrated circuit ("IC") chip to the display panel, heat and pressure are applied thereto, which may cause deformation such as pressing or pushing the adhesive layer. Such deformation of the adhesive layer may cause poor appearance and visibility problems in subsequent processes.

Embodiments are to provide a display device that may prevent a defect in an adhesive layer from occurring when a driving IC chip is attached to a display panel.

In an embodiment of the disclosure, a display device includes a display panel including a display area and a peripheral area, a protective film attached to a lower surface of the display panel, an adhesive layer disposed between the display panel and the protective film, a driving IC chip disposed in the peripheral area and including a long side and a short side, and a heat blocking part disposed in the peripheral area, and spaced apart from the short side of the driving IC chip by a predetermined distance in a direction parallel to the long side.

In an embodiment, the heat blocking part may be spaced apart from the short side of the driving IC chip by about 3 millimeters (mm) to about 5 mm in the direction parallel to the long side.

In an embodiment, the heat blocking part may have a first width in the direction parallel to the long side of the driving IC chip and a second width in a direction crossing the first width, and the first width may be about 5 mm or more.

In an embodiment, the second width of the heat blocking part may be longer than a length of the short side of the driving IC chip.

In an embodiment, the heat blocking part may be disposed in a different layer from the driving IC chip in a cross-sectional view.

In an embodiment, the display panel may include a display layer and a touch electrode layer, the display layer may include a substrate, a transistor disposed on the substrate, and a light-emitting element disposed on the transistor, and the touch electrode layer may include a first insulating layer disposed on the display layer, and a first touch electrode disposed on the first insulating layer. The heat blocking part may include or consist of a same material as a material of the first touch electrode in a same process.

In an embodiment, the heat blocking part may be a floating metal part that is spaced apart from the short side of the driving IC chip by about 3 mm to about 5 mm in the direction parallel to the long side.

In an embodiment, the heat blocking part may have a first width in the direction parallel to the long side of the driving IC chip and a second width in a direction crossing the first width, and the first width may be about 5 mm or more.

In an embodiment, the second width of the heat blocking part may be greater than the short side of the driving IC chip.

In an embodiment, the display panel may include a display layer and a touch electrode layer, the display layer may include a substrate, a transistor disposed on the substrate, and a light-emitting element disposed on the transistor, the touch electrode layer may include a first insulating layer disposed on the display layer, a second insulating layer disposed on the first insulating layer, and a second touch electrode disposed on the second insulating layer, and the heat blocking part may include or consist of a same material as a material of the second touch electrode in a same process.

In an embodiment, the heat blocking part may be a floating metal part that is spaced apart from the short side of the driving IC chip by about 3 mm to about 5 mm in a direction parallel to the long side.

In an embodiment, the heat blocking part may have a first width in the direction parallel to the long side of the driving IC chip and a second width in a direction crossing the first width, and the first width may be about 5 mm or more.

In an embodiment, the second width of the heat blocking part may be greater than the short side of the driving IC chip.

In an embodiment, the display device may further include an anisotropic conductive film ("ACF") disposed between the display panel and the driving IC chip.

In an embodiment, the display device may be a flexible display device.

In another embodiment of the disclosure, a manufacturing method of a display device includes disposing an ACF in a peripheral area of a display panel, disposing a driving IC chip on the ACF, and attaching the driving IC chip to the display panel by applying heat and pressure by a bonding tool. The driving IC chip may include a long side and a short side in a plan view, the bonding tool may include a long side and a short side in a plan view, and a length of the long side of the bonding tool may be smaller than a length obtained by adding about 12 mm to a length of the long side of the driving IC chip.

In an embodiment, the bonding tool may include a first surface directly contacting the driving IC chip and a second surface facing the first surface, and a length of a long side of the second side may be longer than a length of a long side of the first side.

In an embodiment, the bonding tool may form an inclined surface at an end portion of the first surface in a direction of the long side thereof.

In an embodiment, in the attaching the driving IC chip, radiant heat from the bonding tool may be transmitted to the display panel.

In an embodiment, the display device may be a flexible display device.

By the embodiments, it is possible to prevent an adhesive layer from being deformed in a process of attaching a driving IC chip to a display panel. Accordingly, it is possible to prevent problems such as poor appearance of a display device or poor visibility in a subsequent process.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
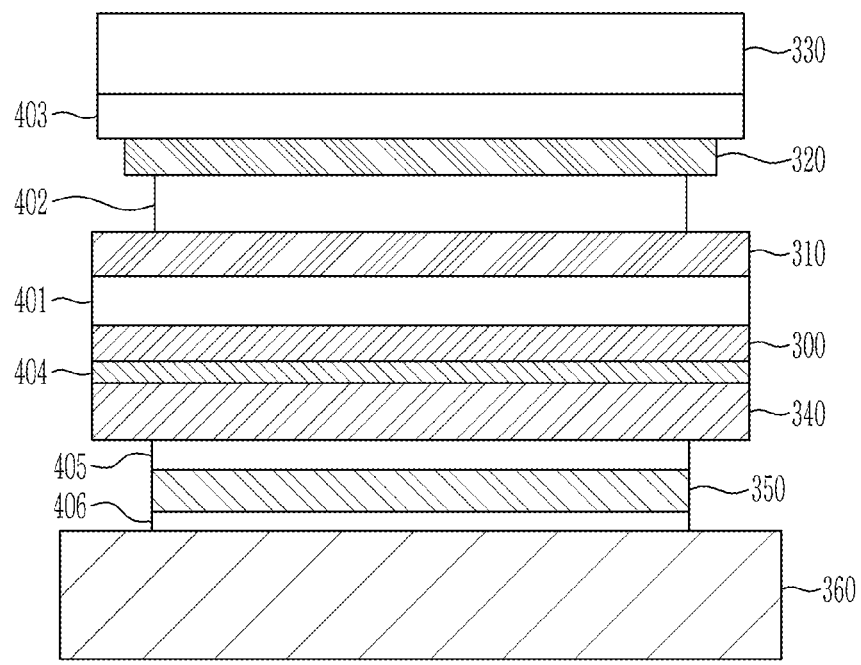
FIG. 1 illustrates a cross-sectional view of an embodiment of a display device.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

In order to clearly describe the disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a cross-sectional view of an embodiment of a display device.

A display device in an embodiment may include a window protecting member 330, a window 320, an anti-reflection layer 310, a display panel 300, a protective film 340, a first support member 350, a second support member 360, and adhesive layers 401, 402, 403, 404, 405, and 406 disposed between them.

Respective constituent elements included in the display device may be attached by the adhesive layers 401, 402, 403, 404, 405, and 406. The adhesive layers 401, 402, 403, 404, 405, and 406 may be a pressure sensitive adhesive ("PSA"). The adhesive layers 401, 402, 403, 404, 405, and 406 may be an optically clear adhesive ("OCA") film or an optically clear resin ("OCR"). Respective adhesive layers 401, 402, 403, 404, 405, and 406 may be the same as or different from each other.

In the display device, an image may be displayed by the display panel 300. The display panel 300 may be a light-emitting display panel including light-emitting elements such as light-emitting diodes. The display panel 300 may be a touch screen panel including a touch electrode layer that may sense touch. The display panel 300 may include or consist of a flexible material to be changed into various shapes. The display panel 300 may be at least partially flexible, stretchable, foldable, bendable, or rollable.

The anti-reflection layer 310 may be disposed on the display panel 300. The anti-reflection layer 310 may be disposed on an upper surface of the display panel 300 on which an image is displayed. The anti-reflection layer 310 may be a polarization film including a linear polarizer, a retarder, or the like, for example. The anti-reflection layer 310 may function to prevent reflection of external light, and blocks light reflected from the inside of the display panel 300 and undesirably outputted therefrom. The anti-reflection layer 310 may be attached to the upper surface of the display panel 300 by the adhesive layer 401 to facilitate recognition of an image provided from the display panel 300.

The window 320 may be disposed on the anti-reflection layer 310. The window 320 may be attached to an upper surface of the anti-reflection layer 310 by the adhesive layer 402 to protect the display panel 300. The window 320 includes or consists of a transparent material, and may include glass or plastic, for example. In an embodiment, the window 320 may include ultra-thin glass ("UTG") having a thickness of about 0.1 mm or less, a transparent polyimide, polyethylene terephthalate ("PET"), polycarbonate ("PC"), or the like, for example.

The window protecting member 330 may be disposed at an upper portion of the window 320. The window protecting member 330 may be attached to an upper surface of the window 320 by the adhesive layer 403. The window protecting member 330 may protect the window 320 from external impact, and may prevent or minimize scratches on the upper surface of the window 320. The window protecting member 330 may include a polymer resin. The window protecting member 330 may include an inorganic material. The protective film 340 may be disposed under the display panel 300. The protective film 340 may be attached to a lower surface of the display panel 300 by the adhesive layer 404. The protective film 340 may serve to support the display panel 300 and to protect the lower surface of the display panel 300. The protective film 340 may include a polymer such as polyethylene terephthalate ("PET"), a silicon-based polymer (e.g., polydimethylsiloxane ("PDMS"), and an elastomer (e.g., elastomeric polyurethane ("EPU")).

The first support member 350 may be disposed under the protective film 340. The first support member 350 may be attached to a lower surface of the protective film 340 by the adhesive layer 405. The first support member 350 is disposed under the display panel 300, and may support the display panel 300. The first support member 350 may include or consist of a polymer resin such as polyethylene terephthalate or a polyimide.

The second support member 360 may be disposed under the first support member 350. The second support member 360 may be attached to a lower surface of the first support member 350 by the adhesive layer 406. The adhesive layer 406 may be a pressure sensitive adhesive ("PSA"). The second support member 360 is disposed under the display panel 300, and may support the display panel 300. The second support member 360 may include fiber reinforced plastic ("FRP") to increase strength and rigidity of the display device. The second support member 360 may include at least one of glass, plastic, and metal.

The display device in the embodiment may include a driving integrated circuit ("IC") chip attached to the display panel in a chip-on-plastic ("COP") panel manner.

Hereinafter, a process of attaching a driving IC chip to the display panel of the display device in the embodiment will be described with reference to FIG. 2 and FIG. 3.

Figure 2:
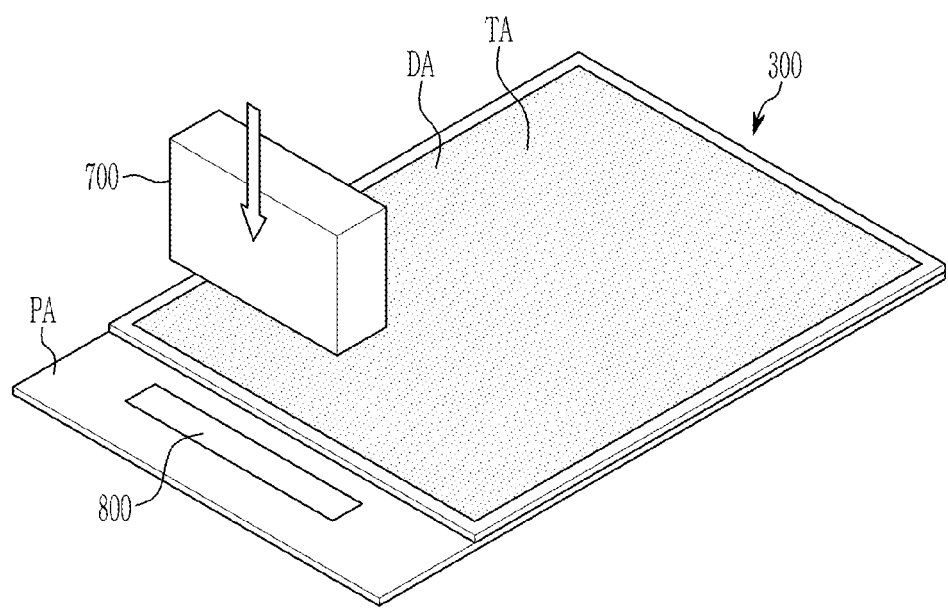
FIG. 2 and FIG. 3 illustrate schematic perspective views of an embodiment of a manufacturing process of a display device.
Figure 3:
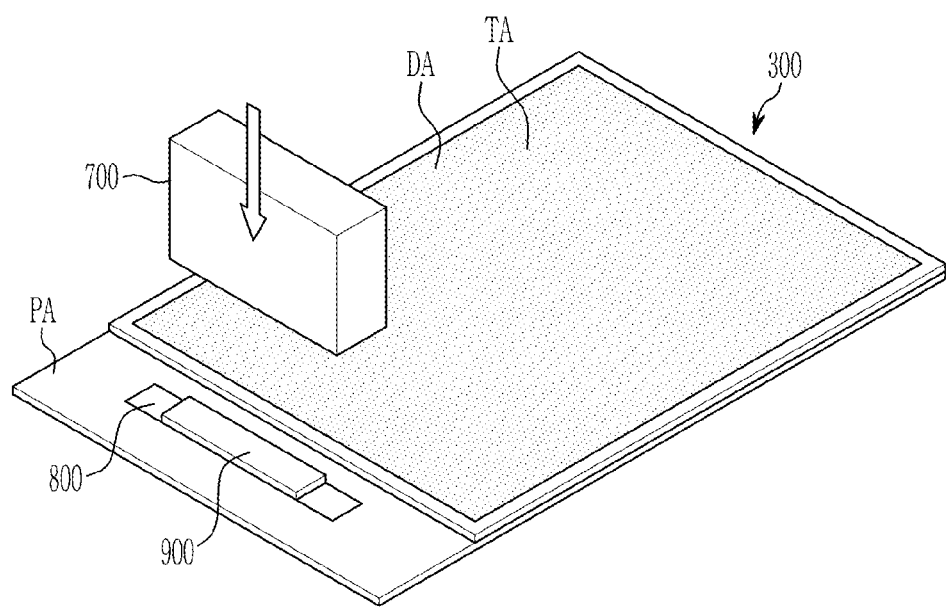

FIG. 2 and FIG. 3 illustrate schematic perspective views of an embodiment of a manufacturing process of the display device. FIG. 2 and FIG. 3 each illustrate an embodiment of a process of attaching a driving IC chip to the display panel of the display device.

As shown in FIG. 2, the display panel 300 of the display device in the embodiment may include a display area DA corresponding to a screen on which an image is displayed, a touch area TA that may sense a touch, and a peripheral area PA in which a driving IC chip is disposed. The display area DA is an area in which a screen is displayed, and a plurality of pixels is disposed in the display area DA. The display area DA of the display panel 300 may have a substantially quadrangular (e.g., rectangular) shape including long sides and short sides, and may have a curved surface by chamfering the corners. However, the shape of the display area DA is merely one of embodiments, and may be changed to have various shapes. When an object directly contacts the touch panel (contact touch) as well as when the object hovers in a state in which it approaches or comes in proximity to the touch panel (non-contact touch), the touch area TA is an area in which such a touch or movement may be sensed as a touch. The touch area TA may overlap or substantially coincide with the display area DA.

The peripheral area PA is an area in which a driving IC chip for driving the plurality of pixels disposed in the display area DA is disposed (e.g., mounted).

It is possible to attach an anisotropic conductive film ("ACF") 800 having conductivity only in a thickness direction onto the peripheral area PA of the display panel 300. The peripheral area PA may have a quadrangular (e.g., rectangular) shape substantially including two long sides and two short sides in a plan view. The ACF 800 may have a quadrangular (e.g., rectangular) shape substantially including two long sides and two short sides in a plan view. The ACF 800 may have a shape extending long in a direction parallel to the long side of the peripheral area PA.

Next, as shown in FIG. 3, a driving IC chip 900 may be disposed on the ACF 800, and the driving IC chip 900 may be attached to the display panel 300 by a bonding tool 700.

The bonding tool 700 may have a cuboidal shape of which one surface has a quadrangular (e.g., rectangular) shape including two long sides and two short sides. The bonding tool 700 may position the driving IC chip 900 on the ACF 800 disposed in the peripheral area PA of the display panel 300, and may apply heat and pressure thereto to attach the driving IC chip 900 to the display panel 300.

The driving IC chip 900 may have a quadrangular (e.g., rectangular) shape substantially including two long sides and two short sides in a plan view. The driving IC chip 900 may have a shape that extends long in a direction parallel to the long side of the ACF 800. The ACF 800 is disposed between the driving IC chip 900 and the display panel 300, and the driving IC chip 900 may be attached to the display panel 300 by the ACF 800.

Although not shown, the driving IC chip 900 may include an input bump, an output bump, or the like, and an input pad, an output pad, or the like may be disposed in the peripheral area PA of the display panel 300. By the ACF 800, the input bump of the driving IC chip 900 and the input pad of the display panel 300 may be electrically connected. Similarly, by the ACF 800, the output bump of the driving IC chip 900 and the output pad of the display panel 300 may be electrically connected.

As described above, in the process of attaching the driving IC chip 900, heating and pressing may be performed, and constituent elements disposed under the display panel 300 may be affected by this environment. In an embodiment, the adhesive layers 404, 405, and 406 disposed under the display panel 300 may be affected, for example. Particularly, the adhesive layer 404 disposed directly below the display panel 300 may be most affected by the heating and pressing. Specifically, radiant heat from the bonding tool 700 may be transmitted to a lower portion of the display panel 300 by heating and pressing the driving IC chip 900 by the bonding tool 700. Accordingly, the adhesive layer (hereinafter also referred to as a lower adhesive layer) 404 of the display panel 300 may be damaged. In an embodiment, the adhesive layer 404 may be agglomerated, pressed, or pushed, and thus dendrites or bubbles may occur in a partial area of the adhesive layer 404, for example. Accordingly, the appearance of the display panel 300 may be deformed, and problems such as poor visibility may occur in a subsequent process. Such deformation of the adhesive layer 404 may frequently occur at positions spaced apart from the boundary of opposite short sides of the driving IC chip 900 with a width of about 4 mm to about 5 mm.

Figure 4:
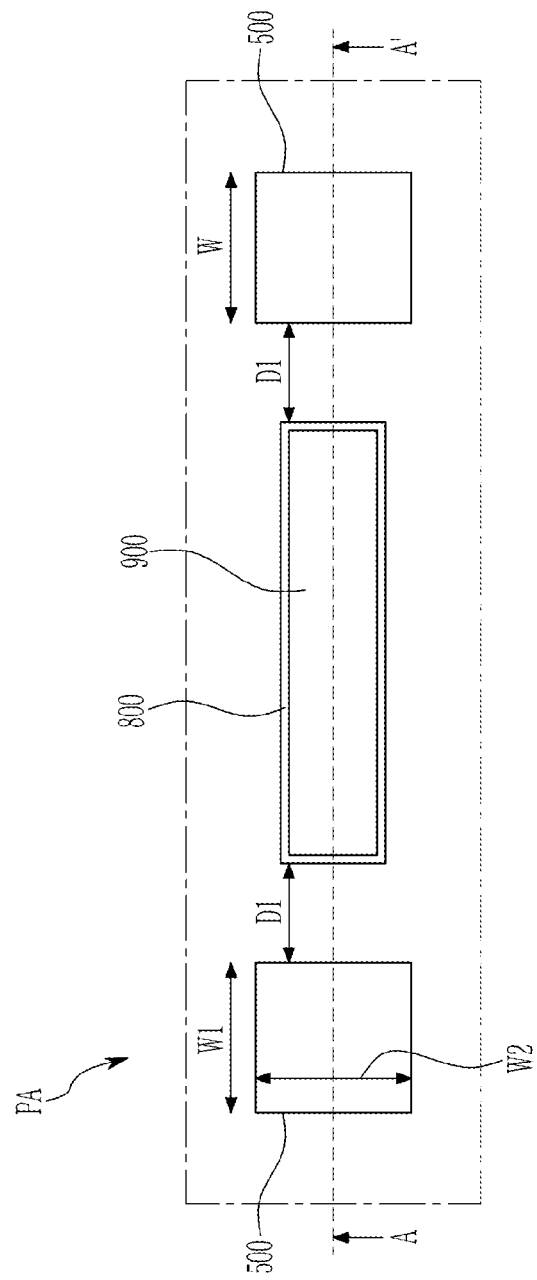
FIG. 4 illustrates a top plan view of an embodiment of a peripheral area of a display device.
Figure 5:
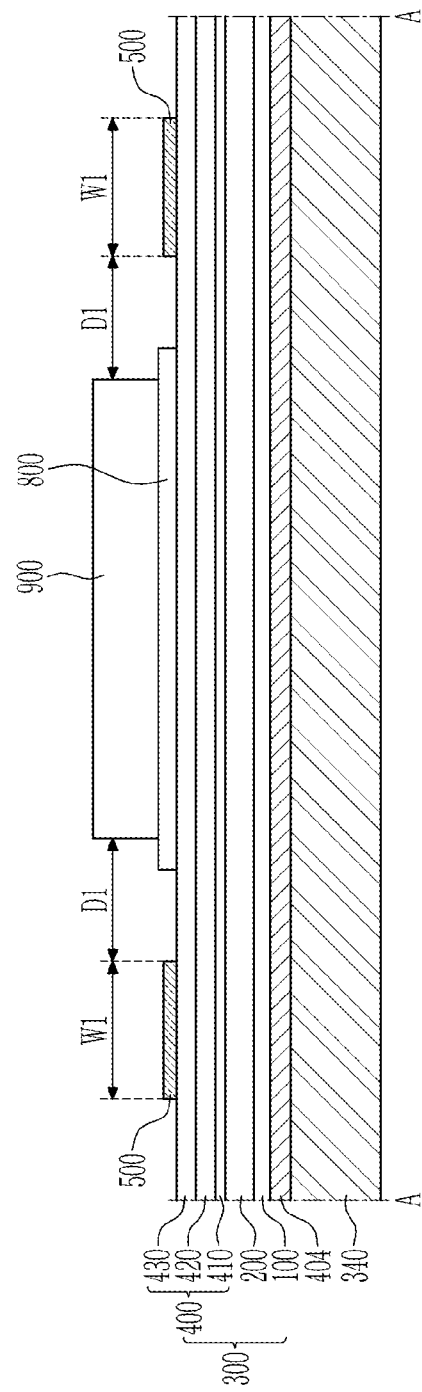
FIG. 5, FIG. 6, and FIG. 7 illustrate cross-sectional views of an embodiment taken along line A-A' of FIG. 4.
Figure 6:
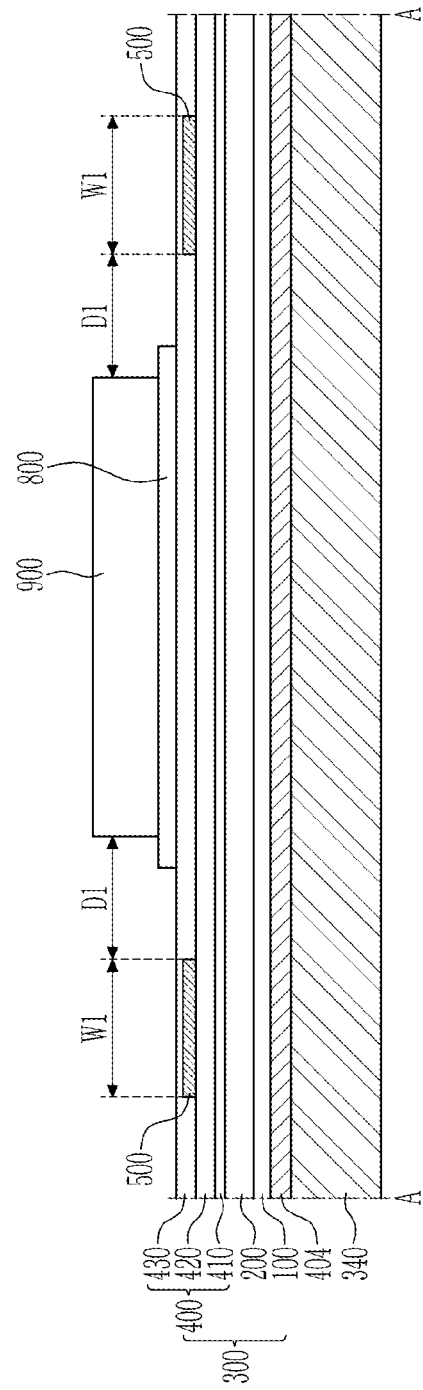
Figure 7:
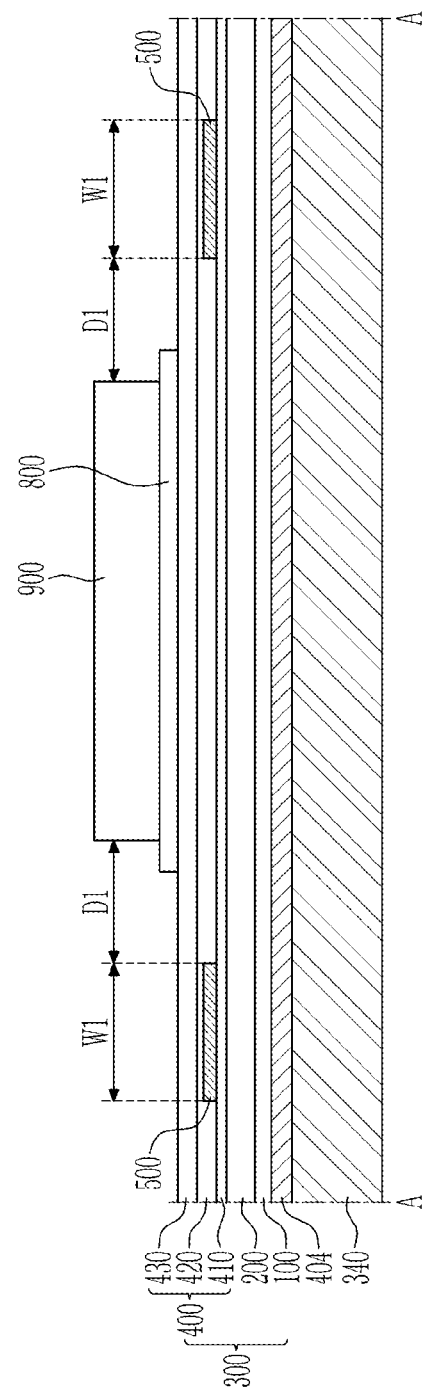

FIG. 4 illustrates a top plan view of an embodiment of a peripheral area in which a driving IC chip is disposed in an embodiment, and FIG. 5, FIG. 6, and FIG. 7 illustrate cross-sectional views of an embodiment taken along line A-A' of FIG. 4.

FIG. 4 to FIG. 7 illustrate the driving IC chip 900 and a heat blocking part 500 disposed in the peripheral area.

Referring to FIG. 4, the display device in the embodiment may include the ACF 800, the driving IC chip 900 on the ACF 800, and the heat blocking part 500 spaced apart from the driving IC chip 900. The driving IC chip 900 may have a quadrangular (e.g., rectangular) shape substantially including two long sides and two short sides in a plan view. The heat blocking part 500 may be spaced apart from the boundary of the short side of the driving IC chip 900 by a predetermined distance D1 in the direction of the long side thereof, e.g., about 2 mm to about 4 mm. The heat blocking part 500 may be disposed at opposite end portions of the driving IC chip 900. In an embodiment, the heat blocking part 500 may be spaced apart from the boundary of the short side in the long side direction of the driving IC chip 900 by about 3 mm, for example. The heat blocking part 500 includes a first width W1 in a direction parallel to the long side of the driving IC chip 900 and a second width W2 in a direction crossing the first width (a direction of the short side direction of the driving IC chip). The first width W1 of the heat blocking part 500 may be about 5 mm or more, and the second width W2 thereof may be greater than the length of the short side of the driving IC chip 900.

FIG. 5 illustrates a cross-sectional view of an embodiment taken along line A-A' of FIG. 4. Referring to FIG. 5, the display panel 300 may include a substrate 100, an insulating layer 200 disposed on the substrate 100, and a touch electrode layer 400 disposed on the insulating layer 200. The insulating layer 200 may include one or more insulating layers configuring a display layer 301 (refer to FIG. 8) in the display area DA. The touch electrode layer 400 may include a first insulating layer 410, a second insulating layer 420, and a passivation layer 430. A first touch conductive layer that may include a first touch electrode may be disposed on the first insulating layer 410, and a second touch conductive layer that may include a second touch electrode may be disposed on the second insulating layer.

The protective film 340 is disposed under the display panel 300. The protective film 340 may be attached to a lower surface of the display panel 300 by the adhesive layer 404.

The ACF 800 may be disposed at the upper portion of the display panel 300, and the driving IC chip 900 may be disposed on the ACF 800. The heat blocking part 500 may be spaced apart from opposite short sides of the driving IC chip 900 by a predetermined distance D1, e.g., about 2 mm to about 4 mm. The heat blocking part 500 may have the first width W1 in a direction parallel to the long side of the driving IC chip 900, and the first width W1 may be about 5 mm or more.

The heat blocking part 500 may include a metal material. In an embodiment, it may include an electrode material of the display layer such as aluminum (Al), copper (Cu), titanium (Ti), molybdenum (Mo), silver (Ag), platinum (Pt), chromium (Cr), nickel (Ni), gold (Au), or the like, for example. The heat blocking part 500 may be implemented as a floating metal part that is not electrically connected to the surroundings. In addition, it may include an insulating material having substantially high thermal conductivity. The heat blocking part 500 may include or consist of a pattern of conductive layers configuring the display panel 300. In an embodiment, the heat blocking part 500 may be implemented by forming a floating metal pattern on one conductive layer forming the touch electrode layer 400 (refer to FIG. 8) disposed at the upper portion of the display panel 300, for example. In addition, it may be implemented by patterning one of conductive layers configuring a transistor, a capacitor, a light-emitting element, or the like disposed in the display layer 301 (refer to FIG. 8) of the display area DA. In addition, the heat blocking part 500 may be implemented by patterning a metal layer or an insulating material on a separate layer.

FIG. 6 and FIG. 7 are different from the embodiment of FIG. 5 in that the heat blocking part 500 is disposed on the touch electrode layer 400. FIG. 6 illustrates that the heat blocking part 500 is disposed on the second insulating layer 420 of the touch electrode layer 400. Specifically, the heat blocking part 500 may be disposed between the second insulating layer 420 and the passivation layer 430. In this case, the heat blocking part 500 may be disposed in the same layer as a second touch conductive layer including a second touch electrode 452 (refer to FIG. 8) formed in the display area DA of the display panel 300 and formed in the same process. The heat blocking part 500 may be spaced apart from the boundary of the short side of the driving IC chip 900 by a predetermined distance D1, e.g., about 2 mm to about 4 mm. The heat blocking part 500 may have the first width W1 in a direction parallel to the long side of the driving IC chip 900, and the first width W1 may be about 5 mm or more. The heat blocking part 500 may be implemented as a floating metal part of the second touch conductive layer.

FIG. 7 illustrates that the heat blocking part 500 is disposed on the first insulating layer 410 of the touch electrode layer 400. Specifically, the heat blocking part 500 may be disposed between the first insulating layer 410 and the second insulating layer 420. In this case, the heat blocking part 500 may be disposed in the same layer as a first touch conductive layer including a first touch electrode 451 (refer to FIG. 8) formed in the display area DA of the display panel 300 and formed in the same process. The heat blocking part 500 may be spaced apart from the boundary of the short side of the driving IC chip 900 by a predetermined distance D1, e.g., about 2 mm to about 4 mm. The heat blocking part 500 may have the first width W1 in a direction parallel to the long side of the driving IC chip 900, and the first width W1 may be about 5 mm or more. The heat blocking part 500 may be implemented as a floating metal part of the first touch conductive layer.

As described above, heating and pressing are performed in the process of attaching the driving IC chip 900, and accordingly, deformation of the adhesive layer 404 disposed under the display panel may mainly occur in an area spaced apart from the boundary of the driving IC chip 900 by about 4 mm to about 5 mm.

The display device in the embodiment may be designed such that the heat blocking part 500 is spaced apart from the boundary of the short side of the driving IC chip 900 by about 3 mm in the long side direction and has a width of at least about 5 mm. Accordingly, it is possible to prevent the radiant heat of the bonding tool from being transmitted to the portion in which the adhesive layer 404 under the display panel 300 is mainly deformed during the attaching process of the driving IC chip 900. Accordingly, it is possible to prevent the lower adhesive layer 404 from being deformed by the heating and pressing in the bonding process.

Figure 8:
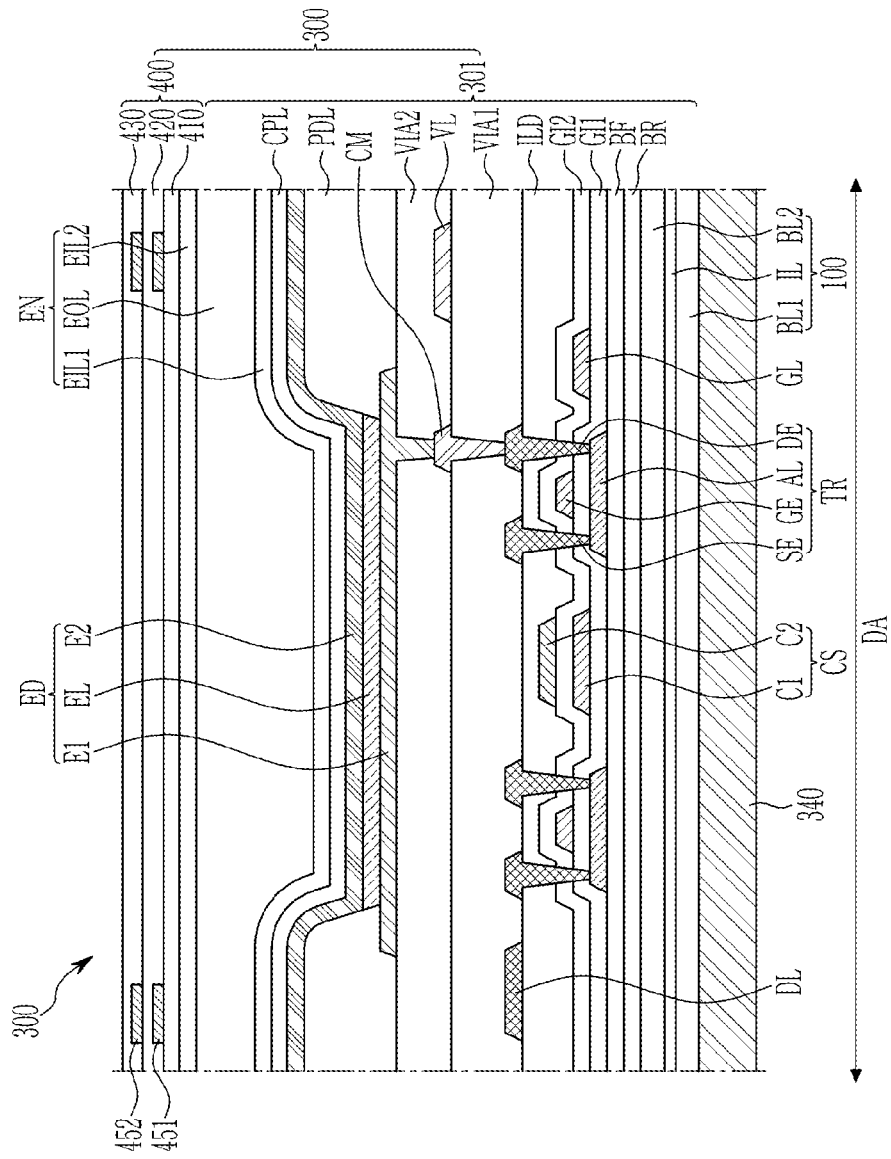
FIG. 8 illustrates a cross-sectional view of an embodiment of a display area of a display device.

FIG. 8 illustrates a schematic cross-sectional view of an embodiment of the display area DA of the display panel. The display panel 300 may include the display layer 301 and the touch electrode layer 400.

The display layer 301 basically includes the substrate 100, a transistor TR disposed on the substrate 100, and a light-emitting element ED connected to the transistor TR. The light-emitting element ED may correspond to a pixel.

The substrate 100 may be a flexible substrate 100 capable of bending, folding, rolling, or the like. The substrate 100 may be a multilayer including a first base layer BL1, an inorganic layer IL, and a second base layer BL2. The first base layer BL1 and the second base layer BL2 may include a polymer resin such as a polyimide ("PI"), a polyamide ("PA"), or a polyethylene terephthalate ("PET"). A barrier layer BR that prevents moisture, oxygen, etc. from penetrating may be disposed on the substrate 100. The barrier layer BR may include an inorganic insulating material such as a silicon nitride (SiNx), a silicon oxide (SiOx), or a silicon oxynitride (SiOxNy), and may be a single layer or a multilayer.

A buffer layer BF may be disposed on the barrier layer BR. The buffer layer BF may block impurities from the substrate 100 when a semiconductor layer is formed, thereby improving characteristics of the semiconductor layer, and flattening a surface of the substrate 100 to reduce stress of the semiconductor layer. The buffer layer BF may include an inorganic insulating material such as a silicon nitride, a silicon oxide, or a silicon oxynitride, and may be a single layer or a multilayer. The buffer layer BF may include amorphous silicon (a-Si).

A semiconductor layer AL of the transistor TR may be disposed on the buffer layer BF. The semiconductor layer AL may include a first area, a second area, and a channel area between the areas. The semiconductor layer AL may include one of amorphous silicon, polysilicon, and an oxide semiconductor. The oxide semiconductor may include at least one of zinc (Zn), indium (In), gallium (Ga), and tin (Sn). In an embodiment, the semiconductor layer AL may include a substantially low temperature polysilicon ("LTPS") or an indium-gallium-zinc oxide ("IGZO"), for example.

A first gate insulating layer GI1 may be disposed on the semiconductor layer AL. The first gate insulating layer GI1 may include an inorganic insulating material such as a silicon nitride, a silicon oxide, or a silicon oxynitride, and may be a single layer or a multilayer.

A first gate conductive layer that may include a gate electrode GE of the transistor TR, a gate line GL, and a first electrode C1 of a storage capacitor CS may be disposed on the first gate insulating layer GI1. The first gate conductive layer may include molybdenum (Mo), aluminum (Al), copper (Cu), titanium (Ti), or the like, and may be a single layer or a multilayer.

A second gate insulating layer GI2 may be disposed on the first gate conductive layer. The second gate insulating layer GI2 may include an inorganic insulating material such as a silicon nitride, a silicon oxide, or a silicon oxynitride, and may be a single layer or a multilayer.

A second gate conductive layer that may include a second electrode C2 of the storage capacitor CS may be disposed on the second gate insulating layer GI2. The second gate conductive layer may include molybdenum (Mo), aluminum (Al), copper (Cu), titanium (Ti), or the like, and may be a single layer or a multilayer.

An inter-insulating layer ILD may be disposed on the second gate insulating layer GI2 and the second gate conductive layer. The inter-insulating layer ILD may include an inorganic insulating material such as a silicon nitride, a silicon oxide, or a silicon oxynitride, and may be a single layer or a multilayer.

A first data conductive layer that may include a first electrode SE and a second electrode DE of the transistor TR, and a data line DL may be disposed on the inter-insulating layer ILD. The first electrode SE and the second electrode DE may be respectively connected to the first area and the second area of the semiconductor layer AL through contact holes of the insulating layers GI1, GI2, and ILD. One of the first electrode SE and the second electrode DE may be a source electrode, and the other thereof may be a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu), and may be a single layer or a multilayer.

A first planarization layer VIA1 may be disposed on the first data conductive layer. The first planarization layer VIA1 may include an organic insulating material such as a general purpose polymer such as poly(methyl methacrylate) ("PMMA") and polystyrene ("PS"), a polymer derivative having a phenol-based group, an acryl-based polymer, an imide-based polymer (e.g., a polyimide ("PI")), or a siloxane-based polymer.

A second data conductive layer that may include a voltage line VL, a connection member CM, or the like, may be disposed on the first planarization layer VIAL. The voltage line VL may transmit a voltage such as a driving voltage, a common voltage, an initialization voltage, or a reference voltage. The connection member CM may be connected to the second electrode DE of the transistor TR through a contact hole of the first planarization layer VIA'. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu), and may be a single layer or a multilayer.

A second planarization layer VIA2 may be disposed on the second data conductive layer. The second planarization layer VIA2 may include an organic insulating material such as a general purpose polymer such as a poly(methyl methacrylate) ("PMMA") and a polystyrene ("PS"), a polymer derivative having a phenol-based group, an acryl-based polymer, an imide-based polymer, or a siloxane-based polymer.

A first electrode E1 of the light-emitting element ED may be disposed on the second planarization layer VIA2. The first electrode E1 may be also referred to as a pixel electrode. The first electrode E1 may be connected to the connection member CM through a contact hole of the second planarization layer VIA2. Therefore, the first electrode E1 may be electrically connected to the second electrode DE of the transistor TR to receive a driving current that controls luminance of the light-emitting diode. The transistor TR to which the first electrode E1 is connected may be a driving transistor, or a transistor electrically connected to the driving transistor. The first electrode E1 may include or consist of a reflective conductive material or a translucent conductive material, or it may include or consist of a transparent conductive material. The first electrode E1 may include a transparent conductive material such as an indium tin oxide ("ITO") or an indium zinc oxide ("IZO"). The first electrode E1 may include a metal such as lithium (Li), calcium (Ca), aluminum (Al), silver (Ag), magnesium (Mg), or gold (Au), or any metal alloys thereof.

A pixel defining layer PDL may be disposed on the second planarization layer VIA2 and the first electrode E1. The pixel defining layer PDL may be also referred to as a bank or a partition wall, and may have an opening overlapping the first electrode E1. The pixel defining layer PDL may include an organic insulating material such as a general purpose polymer such as a poly(methyl methacrylate) ("PMMA") and a polystyrene ("PS"), a polymer derivative having a phenol-based group, an acryl-based polymer, an imide-based polymer, or a siloxane-based polymer.

A light-emitting layer EL of the light-emitting element ED may be disposed on the first electrode E1. A functional layer including at least one of a hole injection layer, a hole transporting layer, an electron transporting layer, and an electron injection layer may be disposed on the first electrode E1 in addition to the light-emitting layer EL.

A second electrode E2 of the light-emitting element ED may be disposed on the light-emitting layer EL. The second electrode E2 may be also referred to as a common electrode. The second electrode E2 may have light transmittance by forming a thin layer of a metal or a metal alloy having a substantially low work function such as calcium (Ca), barium (Ba), magnesium (Mg), aluminum (Al), silver (Ag), or the like. The second electrode E2 may include a transparent conductive oxide such as an indium tin oxide ("ITO") or an indium zinc oxide ("IZO").

The first electrode E1, the emission layer EL, and the second electrode E2 of each pixel may form a light-emitting element ED such as an organic light-emitting diode. The first electrode E1 may be an anode, and the second electrode E2 may be a cathode. A light-emitting area of the light-emitting element ED may correspond to a pixel.

A capping layer CPL may be disposed on the second electrode E2. The capping layer CPL may improve light efficiency through refractive index adjustment. The capping layer CPL may cover an entirety of the second electrode E2. The capping layer CPL may include an organic insulating material or an inorganic insulating material.

An encapsulation layer EN may be disposed on the capping layer CPL. The encapsulation layer EN may encapsulate the light-emitting element ED to prevent moisture or oxygen from penetrating from the outside. The encapsulation layer EN may be a thin film encapsulation layer in which an organic layer EOL is disposed between a first inorganic layer EIL1 and a second inorganic layer EIL2.

The touch electrode layer 400 including touch electrodes may be disposed on the encapsulation layer EN. The touch electrode layer 400 may include the first insulating layer 410 disposed on the encapsulation layer EN. The first insulating layer 410 may cover the encapsulation layer EN to protect the encapsulation layer EN and prevent moisture permeation.

A first touch conductive layer that may include the first touch electrode 451 may be disposed on the first insulating layer 410, and the second insulating layer 420 may be disposed on the first touch conductive layer. A second touch conductive layer that may include the second touch electrode 452 may be disposed on the second insulating layer 420, and the passivation layer 430 may be disposed on the second touch conductive layer.

The first touch electrode layer and the second touch electrode layer may include a metal such as aluminum (Al), copper (Cu), titanium (Ti), molybdenum (Mo), silver (Ag), chromium (Cr), or nickel (Ni).

As described in FIG. 7, the first touch conductive layer may include the heat blocking part 500 spaced apart from the short side of the driving IC chip 900 by a predetermined distance D1 in a peripheral area PA of the display panel 300. The heat blocking part 500 may exist in a form of a floating metal. The first touch electrode 451 may be disposed in the same layer as the heat blocking part 500. Constituent elements included in the first touch electrode layer may include or consist of the same material in the same process.

As described in FIG. 6, the second touch conductive layer may include the heat blocking part 500 spaced apart from the short side of the driving IC chip 900 by the predetermined distance D1 in the peripheral area PA of the display panel 300. The heat blocking part 500 may exist in a form of a floating metal. The second touch electrode 452 may be disposed in the same layer as the heat blocking part 500. Constituent elements included in the second touch electrode layer may include or consist of the same material in the same process.

The first insulating layer 410 and the second insulating layer 420 may include an inorganic insulating material such as a silicon nitride, a silicon oxide, or a silicon oxynitride, and may be a single layer or a multilayer. The passivation layer 430 may include an inorganic insulating material such as a silicon nitride, a silicon oxide, or a silicon oxynitride, or an organic material such as an acryl-based polymer or a polyimide-based resin.

The protective film 340 may be disposed under the display panel 300. The display panel 300 may be protected in the manufacturing process of the display device of the protective film 340. The display panel 300 and the protective film 340 are attached by an adhesive layer (not shown).

Figure 9:
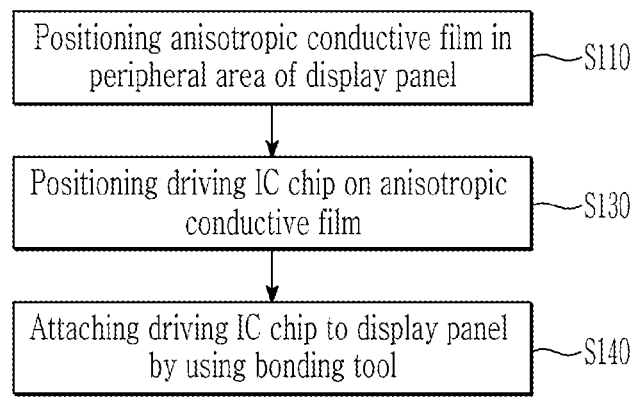
FIG. 9 illustrates a flowchart of an embodiment of a manufacturing process of a display device.

FIG. 9 illustrates a flowchart of an embodiment of a manufacturing process of a display device.

First, an ACF is disposed in the peripheral area of the display panel (S110). The ACF may have a quadrangular (e.g., rectangular) shape substantially including two long sides and two short sides in a plan view. In this case, the long side of the ACF may be disposed in a direction parallel to the long side of the peripheral area.

Next, the driving IC chip is disposed on the ACF (S130). The driving IC chip may have a quadrangular (e.g., rectangular) shape substantially including two long sides and two short sides in a plan view. In this case, the long side of the driving IC chip may be disposed in a direction parallel to the long side of the ACF. The driving IC chip overlaps the ACF.

Thereafter, the driving IC chip may be attached to the display panel by applying heat and pressure by a bonding tool (S140). In this way, the ACF is disposed between the driving IC chip and the display panel, and the driving IC chip may be attached to the display panel by the ACF.

Figure 10:
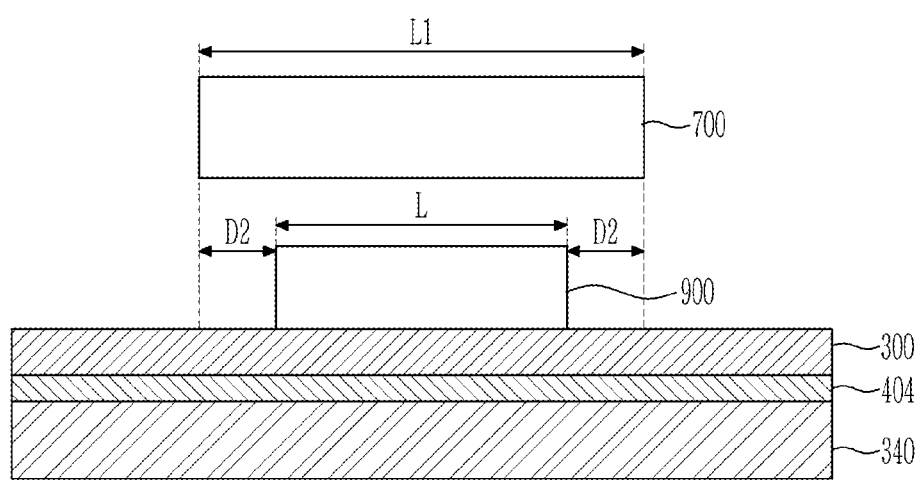
FIG. 10 and FIG. 11 illustrate schematic cross-sectional views of an embodiment of a manufacturing process of a display device.
Figure 11:
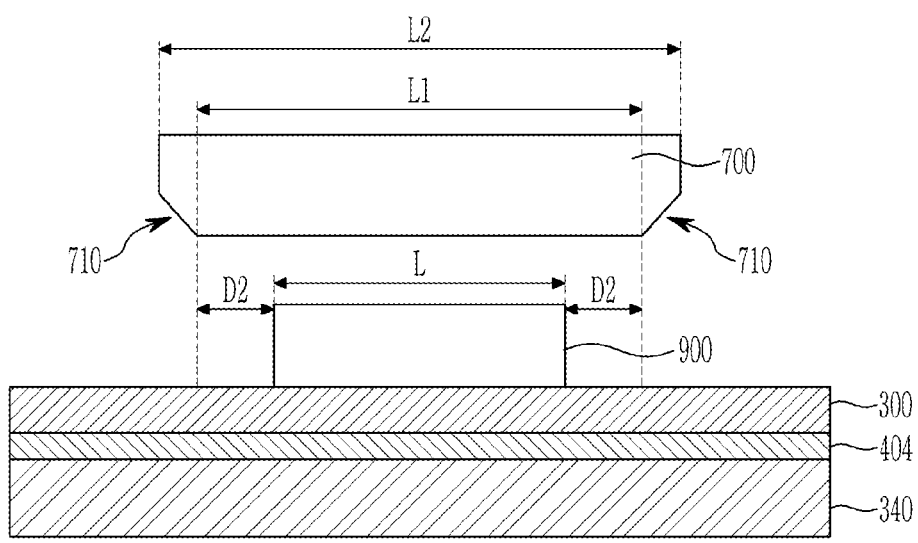

FIG. 10 and FIG. 11 illustrate schematic cross-sectional views of an embodiment of a manufacturing process of a display device.

Referring to FIG. 10, the protective film 340 is disposed under the display panel 300, and the adhesive layer 404 is disposed between the display panel 300 and the protective film 340. The display panel 300 and the protective film 340 are attached by the adhesive layer 404.

The driving IC chip 900 is disposed on the display panel 300. The driving IC chip 900 may be attached to a partial area of the display panel 300 by the bonding tool 700. The bonding tool 700 may have a cuboidal shape of which one surface has a quadrangular (e.g., rectangular) shape including two long sides and two short sides. As shown in FIG. 10, a length L1 of a long side of a bottom surface of the bonding tool 700 is added by a predetermined length D2 from respective ends of the driving IC chip 900, so that the length L1 may be finally twice as long as the predetermined length D2 than the length L of the driving IC chip. In an embodiment, the predetermined distance D2 may be about 6 mm or less, and the length L1 of the long side of the bonding tool 700 may be a length (L+12 mm) to be less than or equal to the length L of the driving IC chip plus 12 mm, for example.

The following table shows a defect occurrence rate according to the length L1 of the long side of the bonding tool 700.

Table 1 shows experimental results in which the length L1 of the long side of the bonding tool 700 is set to the length L of the long side of the driving IC chip 900 plus 2 mm, 8 mm, 10 mm, 12 mm, and 14 mm, and a defect rate occurring during an attachment process using respective bonding tools 700 having different lengths is tested.

TABLE 1

| Bonding tool length L1 (mm) | Defect rate (%) |
| --- | --- |
| Length (L) of driving IC chip + 14 mm | 40% |
| Length (L) of driving IC chip + 12 mm | 0% |
| Length (L) of driving IC chip + 10 mm | 0% |
| Length (L) of driving IC chip + 8 mm | 0% |
| Length (L) of driving IC chip + 2 mm | 0% |

As shown in the results of Table 1, it was confirmed that when the length L1 of the long side of the bonding tool 700 was 14 mm or more than the length L of the driving IC chip as the attachment object, the defect rate in the adhesive layer 404 was 40%, and when an additional length of 12 mm or less was added than the length L of the driving IC chip, almost no defects occurred. Accordingly, in the process of attaching the driving IC chip 900 in the embodiment, by setting the length L1 of the long side of the bonding tool 700 to 12 mm or less than the length L of the long side of the driving IC chip 900, it is possible to minimize the heat generated by the bonding tool 700 to be transmitted to the lower portion of the display panel 300, and thus, the defect occurring in the adhesive layer 404 under the display panel 300 may be prevented.

FIG. 11 illustrates a structure in which the bonding tool 700 of FIG. 10 includes an inclined surface 710 at a lower portion thereof. The bonding tool 700 may include a first surface (a bottom surface) directly contacting the driving IC chip 900 during the attachment process, and a second surface (a top surface) facing the first surface, and a length L2 of a long side of the second surface may be longer than a length L1 of a long side of the first surface. In an embodiment, the length L2 of the long side of the second surface opposite to the first surface of the bonding tool 700 may be implemented to be longer than the length L of the driving IC chip 900 plus 12 mm, for example. In this case, as shown in FIG. 11, the bonding tool 700 may include the inclined surface 710 at a lower portion of a side connecting the short side of the first surface and the short side of the second surface. A distance between the first and second surfaces of the bonding tool 700 may be a thickness of the bonding tool.

That is, since the length L1 of the long side of the first surface of the bonding tool 700 and the length L2 of the long side of the second surface of the bonding tool 700 are different from each other, a predetermined inclined surface 710 may be formed at opposite end portions in a long side direction of the first surface of the bonding tool 700. Accordingly, it is possible to reduce the transmission of heat from the bonding tool 700 to the lower display panel 300 from the inclined surfaces 710 at opposite sides of the bonding tool 700.

In the process of attaching the driving IC chip 900 to the display panel 300 by the bonding tool 700, since the first surface of the bonding tool 700 and the display panel 300 contact each other, even when the length L2 of the long side of the second surface of the bonding tool 700 is relatively long, by configuring the length L1 of the long side of the first surface to be about 12 mm or less than the length L of the driving IC chip, heat generated by the bonding tool 700 is minimized from being transmitted to the lower portion of the display panel 300, and accordingly, defects occurring in the adhesive layer 404 under the display panel 300 may be prevented.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
   a display panel including a display area and a peripheral area;
   a protective film attached to a lower surface of the display panel;
   an adhesive layer disposed between the display panel and the protective film;
   a driving integrated circuit chip disposed in the peripheral area and including a long side and a short side; and
   a heat blocking part disposed in the peripheral area, and spaced apart from the short side of the driving integrated circuit chip by a predetermined distance in a direction parallel to the long side.

2. The display device of claim 1, wherein
   the heat blocking part is spaced apart from the short side of the driving integrated circuit chip by 3 millimeters to 5 millimeters in the direction parallel to the long side.

3. The display device of claim 1, wherein
   the heat blocking part has a first width in the direction parallel to the long side of the driving integrated circuit chip and a second width in a direction crossing the first width, and the first width is 5 millimeters or more.

4. The display device of claim 3, wherein
   the second width of the heat blocking part is greater than a length of the short side of the driving integrated circuit chip.

5. The display device of claim 1, wherein
   the heat blocking part is disposed in a different layer from the driving integrated circuit chip in a cross-sectional view.

6. The display device of claim 1, wherein:
   the display panel includes a display layer and a touch electrode layer;
   the display layer includes:
      a substrate,
      a transistor disposed on the substrate, and
      a light-emitting element disposed on the transistor;
   the touch electrode layer includes:
      a first insulating layer disposed on the display layer, and
      a first touch electrode disposed on the first insulating layer;

wherein the heat blocking part is disposed in a same layer as the first touch electrode.

7. The display device of claim 6, wherein
the heat blocking part is a floating metal part which is spaced apart from the short side of the driving integrated circuit chip by 3 millimeters to 5 millimeters in the direction parallel to the long side.

8. The display device of claim 7, wherein
the heat blocking part has a first width in the direction parallel to the long side of the driving integrated circuit chip and a second width in a direction crossing the first width, and the first width is 5 millimeters or more.

9. The display device of claim 8, wherein
the second width of the heat blocking part is greater than the short side of the driving integrated circuit chip.

10. The display device of claim 1, wherein:
the display panel includes a display layer and a touch electrode layer;
the display layer includes:
  a substrate,
  a transistor disposed on the substrate, and
  a light-emitting element disposed on the transistor;
the touch electrode layer includes:
  a first insulating layer disposed on the display layer,
  a second insulating layer disposed on the first insulating layer, and
  a second touch electrode disposed on the second insulating layer; and
the heat blocking part is disposed in a same layer as the second touch electrode.

11. The display device of claim 10, wherein
the heat blocking part is a floating metal part which is spaced apart from the short side of the driving integrated circuit chip by 3 millimeters to 5 millimeters in the direction parallel to the long side.

12. The display device of claim 11, wherein
the heat blocking part has a first width in the direction parallel to the long side of the driving integrated circuit chip and a second width in a direction crossing the first width, and the first width is 5 millimeters or more.

13. The display device of claim 12, wherein
the second width of the heat blocking part is greater than the short side of the driving integrated circuit chip.

14. The display device of claim 1, further comprising
an anisotropic conductive film disposed between the display panel and the driving integrated circuit chip.

15. The display device of claim 1, wherein
the display device is a flexible display device.

16. A manufacturing method of a display device, the method comprising:
disposing an anisotropic conductive film in a peripheral area of a display panel;
disposing a driving integrated circuit chip on the anisotropic conductive film; and
attaching the driving integrated circuit chip to the display panel by applying heat and pressure by a bonding tool,
wherein the driving integrated circuit chip includes: a long side and a short side in a plan view;
the bonding tool includes a long side and a short side in the plan view; and
a length of the long side of the bonding tool is smaller than a length obtained by adding 12 millimeters to a length of the long side of the driving integrated circuit chip.

17. The manufacturing method of the display device of claim 16, wherein
the bonding tool includes a first surface directly contacting the driving integrated circuit chip and a second surface facing the first surface, and
a length of a long side of the second side is longer than a length of a long side of the first side.

18. The manufacturing method of the display device of claim 17, wherein
the bonding tool forms an inclined surface at an end portion of the first surface in a direction of the long side thereof.

19. The manufacturing method of the display device of claim 16, wherein
in the attaching the driving integrated circuit chip, radiant heat from the bonding tool is transmitted to the display panel.

20. The manufacturing method of the display device of claim 16, wherein
the display device is a flexible display device.

* * * * *